(12) United States Patent
Mactaggart

(10) Patent No.: US 9,203,602 B1
(45) Date of Patent: Dec. 1, 2015

(54) NON-RETURN-TO-ZERO (NRZ) DATA LOCK DETECTION SYSTEM AND METHOD

(71) Applicant: Tyco Electronics Corporation, Berwyn, PA (US)

(72) Inventor: Iain Ross Mactaggart, Eden Prairie, MN (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 14/299,047

(22) Filed: Jun. 9, 2014

(51) Int. Cl.
*H03D 3/34* (2006.01)
*H04L 7/00* (2006.01)

(52) U.S. Cl.
CPC .................. *H04L 7/0054* (2013.01)

(58) Field of Classification Search
CPC ....... H03L 7/095; H03L 7/0891; H03L 7/099; H03L 7/091; H03L 7/0807; H03L 7/089; H03L 7/183; H03L 7/06; H03L 7/0805; H03L 7/146; H03L 2207/50; H03L 7/0818; H03L 7/143; H03L 7/0991; H03L 7/033
USPC ......... 375/376, 373, 371, 327, 374, 294, 340; 327/156, 147, 157, 42, 291, 299
See application file for complete search history.

(56) References Cited

U.S. PATENT DOCUMENTS

| | | | |
|---|---|---|---|
| 6,331,792 B1 * | 12/2001 | Tonietto | 327/48 |
| 6,433,899 B1 | 8/2002 | Anslow | |
| 6,747,518 B1 * | 6/2004 | Chung | 331/1 A |
| 6,785,354 B1 * | 8/2004 | Dietrich | 375/373 |
| 7,183,863 B1 * | 2/2007 | Bedrosian | 331/25 |

* cited by examiner

*Primary Examiner* — Rahel Guarino

(57) ABSTRACT

A data lock detection system may include a receiver configured to receive a data signal, a phase detector configured to output a phase detection output signal representative of the data signal with respect to a clock signal, and a lock detector configured to receive the phase detection output signal. The lock detector is configured to determine a presence of a frequency difference between the data signal and the clock signal and output a lock determination output signal that indicates if the data signal is locked or unlocked with the clock signal.

18 Claims, 3 Drawing Sheets

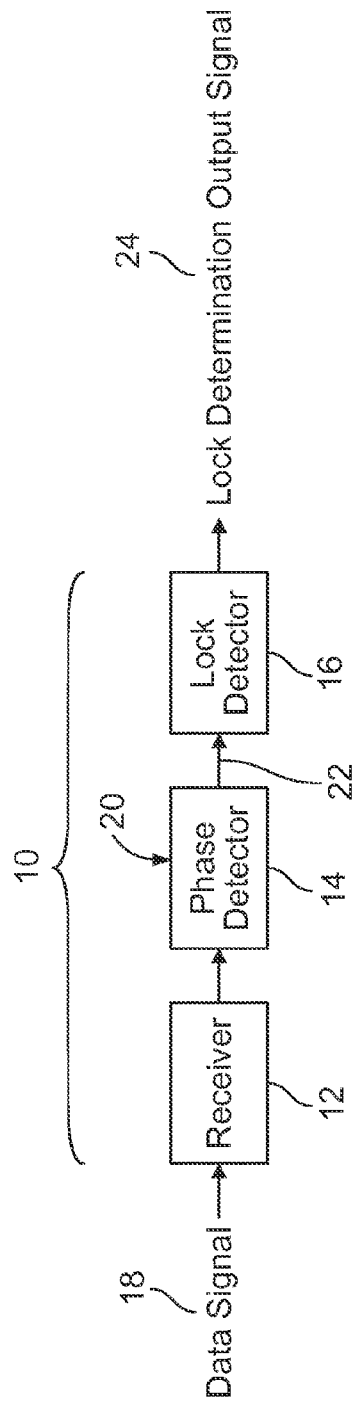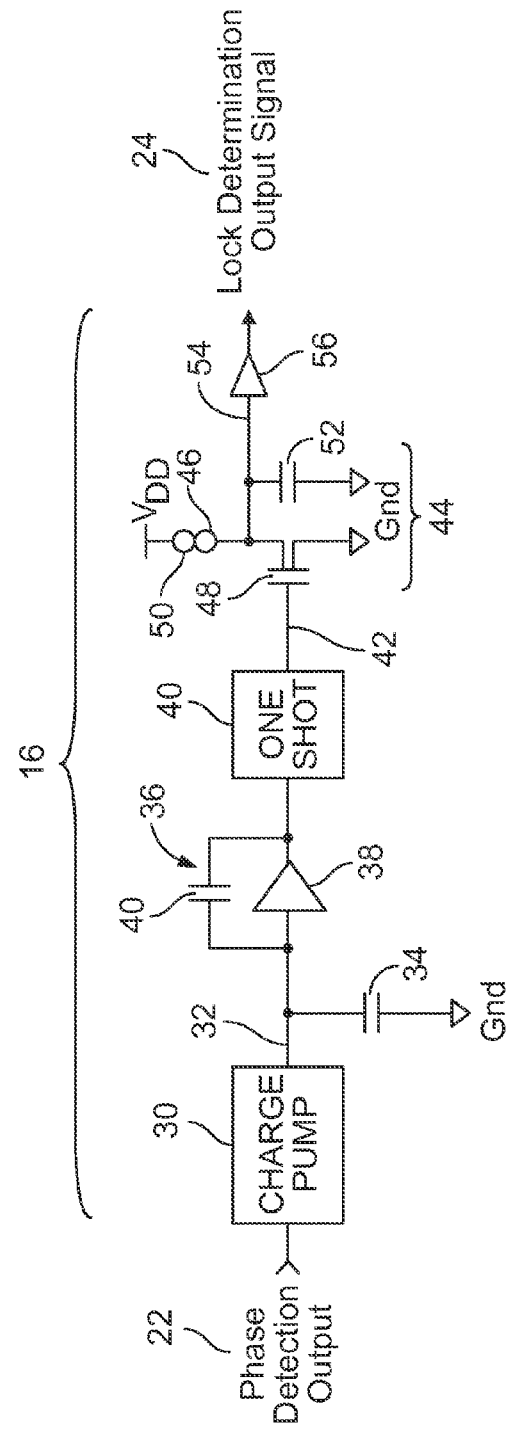

NON-RETURN-TO-ZERO (NRZ) DATA LOCK DETECTION SYSTEM AND METHOD

BACKGROUND OF THE DISCLOSURE

Embodiments of the present disclosure generally relate to data lock detection systems and methods that are configured to determine whether a data signal, such as non-return-to-zero (NRZ) data signal, is locked or unlocked with a clock signal.

Non-return-to-zero (NRZ) is a form of digital data transmission in which binary low and high states are transmitted by specific and constant direct current voltages. In positive-logic NRZ, the low state may be represented by the more negative or less positive voltage, and the high state may be represented by the less negative or more positive voltage. For example, a logic state of 0 may be represented by 0.5 volts, while the logic state of 1 may be represented by represented by 1 volt. Conversely, in negative-logic NRZ, the low state may be represented by the more positive or less negative voltage, while the high state may be represented by the less positive or more negative voltage. For example, a logic state of 0 may be represented by 1 volt, while the logic state of 1 may be represented by 0.5 volts. In general, NRZ data includes binary code in which 1s are represented by one significant condition (such as a positive voltage) and 0s are represented by another significant condition (usually a negative voltage), with no other neutral or rest condition.

NRZ data may be displayed with respect to an eye diagram or pattern. In an eye diagram, a data signal is repetitively sampled and applied to a vertical input, while the data rate is used to trigger a horizontal sweep. The display is referred to as an eye diagram because the pattern appears as a series of eyes between a pair of rails.

An eye diagram provides an indication of the quality of signals in high-speed digital transmissions, for example. An oscilloscope, for example, may generate an eye diagram by overlaying sweeps of different segments of a long data stream driven by a master clock. When many such transitions have been overlaid, positive and negative pulses are superimposed on each other. When many bits are overlaid, the resulting image appears similar to the opening of an eye.

Typically, it is desirable to determine the phase relationship between a sample clock and NRZ data. The phase relationship between the sample clock and the NRZ data is defined to be the same (that is, there is no difference between the phase of the sample clock and the NRZ data) when the data is being sampled at the center of the eye diagram. Data sampled at the center of the eye is typically reliable. However, when the phase relationship between the sample clock and the NRZ data differs, data may no longer be sampled from the eye center, and therefore the data may be less reliable. Accordingly, determining whether the NRZ data is locked with respect to the sample clock provides information as to the reliability of the data.

A known system and method for determining whether NRZ data is locked with a sample clock includes a reference oscillator with quadrature phases. However, such a system and method may be relatively complex and may require a relatively large amount of energy to operate.

BRIEF DESCRIPTION OF THE DISCLOSURE

Certain embodiments of the present disclosure provide a data lock detection system that may include a receiver configured to receive a data signal (such as an NRZ data signal), a phase detector configured to output a phase detection output signal representative of the data signal with respect to a clock signal, and a lock detector configured to receive the phase detection output signal. The lock detector is configured to determine a presence of a frequency difference between the data signal and the clock signal and output a lock determination output signal that indicates if the data signal is locked or unlocked with the clock signal.

The data signal may be locked with the clock signal when the frequency difference between the data signal and the clock signal is zero. The data signal may be unlocked with the clock signal when the frequency difference is a beat frequency between the data signal and the clock signal.

In at least one embodiment, the lock detector may include a one-shot circuit configured to output a one-shot output signal that indicates whether or not a beat frequency exists between the data signal and the clock signal. The lock detector may include a lock-detecting charge pump having a charge pump integrator and a switch. The switch resets a current source upon detection of a beat frequency between the data signal and the clock signal. A resetting of the current source indicates that the data signal is unlocked with the clock signal. The lock detector may also include a receiving charge pump that receives the phase detection output from the phase detector.

The system may also include a filtering circuit that is configured to filter the phase detection output signal. In at least one embodiment, the filtering circuit may include one or both of a charge integrating capacitor and a hysteresis circuit.

Certain embodiments of the present disclosure provide a data lock detection method that may include receiving a data signal, outputting a phase detection output signal with a phase detector, wherein the phase detection output signal is representative of the data signal with respect to a clock signal, using a lock detector to determine a presence of a frequency difference between the data signal and the clock signal, and outputting a lock determination output signal that indicates if the data signal is locked or unlocked with the clock signal.

The outputting a lock determination output signal operation may include outputting a locked signal when the frequency difference between the data signal and the clock signal is zero. The outputting a lock determination output signal may include outputting an unlocked signal when the frequency difference is a beat frequency between the data signal and the clock signal.

The method may also include resetting a current source upon detection of a beat frequency between the data signal and the clock signal. The resetting of the current source may be indicative of the data signal being unlocked with the clock signal.

BRIEF DESCRIPTION OF THE DRAWINGS

FIG. 1 illustrates a schematic block diagram of an NRZ data lock detection system, according to an embodiment of the present disclosure.

FIG. 2 illustrates a schematic block diagram of a lock detector, according to an embodiment of the present disclosure.

DETAILED DESCRIPTION OF THE DISCLOSURE

Figure 3:
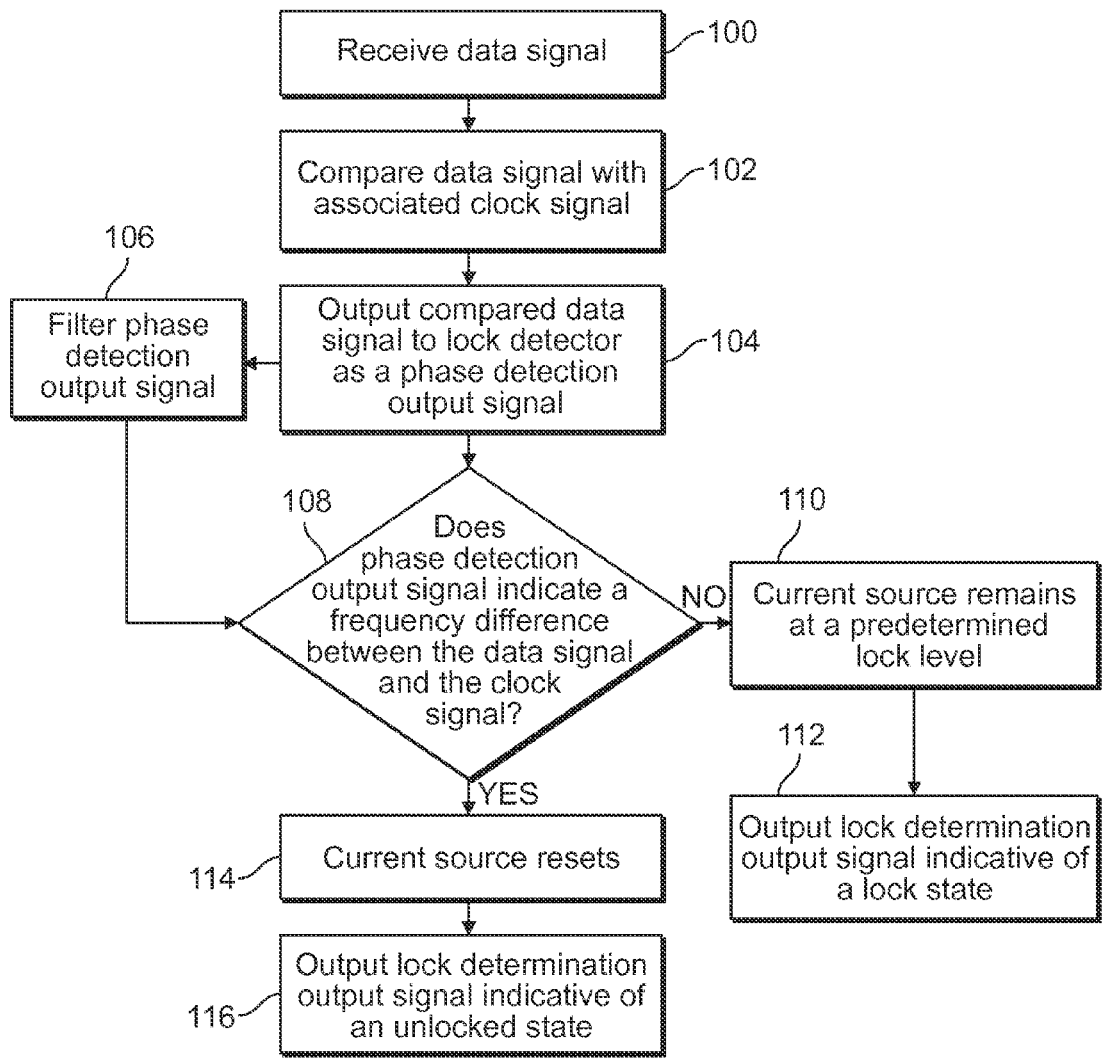
FIG. 3 illustrates a flow chart of an NRZ data lock detection method, according to an embodiment of the present disclosure.

FIG. 1 illustrates a schematic block diagram of an NRZ data lock detection system 10, according to an embodiment of the present disclosure. The NRZ data lock detection system 10 may include a receiver 12 in communication (such as being electrically connected through a wired or wireless connection) with a phase detector 14, which is, in turn, in communication with a lock detector 16. In at least one embodiment, the receiver 12 may include the phase detector 14, for example, or the phase detector 14 may include the receiver 12. Optionally, the receiver 12 and the phase detector 14 may be separate and distinct components. Also, the phase detector 14 and the lock detector 16 may be part of the same circuit, for example. Further, the receiver 12, the phase detector 14, and the lock detector 16 may be part of a single integrated circuit, chip, module, printed circuit board, and/or the like.

The receiver 12 is configured to receive a data signal 18, such as an NRZ data signal. The data signal 18 is received by the receiver 12, which may include a clock-and-data-recovery (CDR) circuit. Optionally, the phase detector 14 may include the CDR circuit. The phase detector 14 receives the data signal 18 and samples the NRZ data signal over time to determine phase transitions between logic states, for example. The phase detector 14 may receive the data signal 18 and a clock signal or sample reference clock 20. The data signal 18 and the clock signal or sample reference clock 20 may be separate and distinct signals that are received by the phase detector 14.

The phase detector 14 may include a frequency mixer, an analog multiplier or a logic circuit that generates a voltage signal that represents the difference in phase between two signal inputs, such as the data signal 18 ant the clock signal 20. The phase detector 14 may include a local oscillator and may output a sampled data signal that may include data regarding the relative phase and time position of a local oscillator (for example, the clock signal 20) within the phase detector 14 with respect to the data signal 18, such as an NRZ data signal. The phase detector 14 outputs a phase detection output signal 22 to the lock detector 16. The phase detection output 22 may include the data signal 18 and the clock signal 20, or representations thereof.

The lock detector 16 receives the phase detection output signal 22 and determines whether the data signal 18 is locked with the clock signal 20. For example, the lock detector 16 may be configured to determine a beat frequency, which may be a difference between the frequency of the data signal 18 and the frequency of the clock signal 20. The lock detector 16 outputs a lock determination output signal 24, which indicates whether or not the data signal 18 is locked (for example, in phase) with the clock signal 20. The NRZ data lock detection system 10 provides a low power (for example, 1 mA or less) system and method for determining whether the data signal 18 is locked with the clock signal 20.

FIG. 2 illustrates a schematic block diagram of the lock detector 16, according to an embodiment of the present disclosure. The lock detector 16 may be or include a circuit, computer, module, or the like that is configured to determine whether the phase detection output 22 received from the phase detector 14 (shown in FIG. 1) indicates that the data signal 18 is locked with the clock signal 20. The phase detection output signal 22 may include signals representative of the data signal 18 and the clock signal 20. The lock detector 16 may compare the data signal 18 to the clock signal 20 to determine whether or not there is a frequency difference (that is, a beat frequency) therebetween. If a beat frequency is present, the lock detector 16 outputs the lock determination output signal 24 as being indicative of an unlocked condition or state. If, however, no beat frequency is present, the lock detector 16 outputs the lock determination output signal 24 as being indicative of a locked condition or state.

The lock detector 16 is configured to detect the presence of a beat frequency between the local oscillator, such as the clock signal 20, and the incoming data signal 18, such as an NRZ data signal. That is, the lock detector 16 is configured to detect the presence of the beat frequency between the data signal 18 and the clock signal 20.

Referring to FIGS. 1 and 2, when the data signal 18 received by the CDR circuit (and/or the phase detector 14), for example, is not fully locked with the clock signal 20, the frequency of the data signal 18, such as the NRZ data signal, and the frequency of the local oscillator (for example, the clock signal 20) are not equal. The resulting difference between the data signal 18 and the clock signal 20 is manifested as a beat frequency.

For example, if the frequency difference between the data signal 18 and the clock signal 20 is zero, then no beat frequency is present. If, however, a difference between the data signal 18 and the clock signal 20 exists, then a beat frequency is present. The beat frequency may form and be represented by a sinusoidal waveform. As one specific example, if the data signal 18 is an NRZ data signal that arrives over a 40 picosecond (ps) period (25 GHz), and the clock signal arrives at 41 ps period (approximately 24.4 GHz), the resulting frequency difference is approximately 0.60 GHz. Accordingly, the beat frequency is approximately 0.60 GHz.

The lock detector 16 may use the presence of a beat frequency to output a signal indicative of an out-of-lock condition between the data signal 18 and the clock signal 20. That is, by detecting the presence of a beat frequency, the lock detector 16 determines that the data signal 18 is not locked with the clock signal 20. If, however, the lock detector 16 does not detect the existence of a beat frequency, then the data signal 18 is locked with the clock signal 20.

As noted above, the phase detector 14 outputs a phase response, such as the phase detection output signal 22, which may be periodic with respect to the phase of the data signal 18 and the clock signal 20 (the clock signal 20 may be derived from the local oscillator). The phase detection output signal 22 may be an electrical signal that may take the form of a voltage or a current. In at least one output, the phase detection output signal 22 may be a voltage that is received by a first or receiving charge pump 30. The charge pump 30 receives the phase detection output signal 22 and may convert the voltage to a current. The charge pump 30 then outputs a phase response output signal 32 to a filtering circuit, which may include a current to a charge-integrating capacitor 34.

The charge-integrating capacitor 34 may be used to frequency-shape the phase response output signal 32. By frequency-shaping the phase response output signal 32, the charge-integrating capacitor 34 may provide a low-pass frequency filter to the phase response output signal 32. As such, random noise and jitter within the phase response output signal 32 may be removed, and the signal quality of any beat frequency may be improved.

The filtering circuit may also include a hysteresis circuit 36, which may further remove the effects of random noise. The hysteresis circuit 36 may include a positive gain element 38 and a feedback capacitor 40. If, for example, the hysteresis circuit 36 is configured as a rail-to-rail complementary metal oxide semiconductor (CMOS) circuit, the positive gain element 38 may be implemented with two invertor stages, and the feedback capacitor 40 may be operatively connected to the same node as shared with the integrating capacitor 34. As such, the lock detector 16 may include a filtering circuit, which may include both a low-pass filter in the form of the integrating capacitor 34 and a hysteresis circuit 36, in a compact circuit arrangement that allows high frequency noise to be attenuated.

The output of the positive gain element 38 may take the form of a fully digital clock signal with a frequency equal to the beat frequency generated from the frequency difference between the data signal 18, such as the NRZ data signal, and the clock signal 20 from the local oscillator. In order to determine whether the data signal 18 is locked with the clock signal 20, the lock detector 16 detects whether or not a beat frequency is present.

Alternatively, the lock detector 16 may not include one or both of the integrating capacitor 34 or the hysteresis circuit 36. Instead, the phase response output signal 32 may be output by the charge pump 30 and received by a one-shot circuit 40. Accordingly, the one shot circuit 40 receives the phase response output 32, whether or not it is filtered by the integrating capacitor 34 and/or the hysteresis circuit 36. If a beat frequency is present, the phase response output signal 32 includes the beat frequency, whether or not the phase response output 32 is filtered.

To detect the presence of the beat frequency (or a beat frequency clock), the phase response output signal 32 may be received by the one-shot circuit 40. The one-shot circuit 40 may be a monostable multivibrator electronic circuit that may include one or more amplifying devices, such as transistors, cross-coupled with resistors or capacitors. The one-shot circuit 40 may exhibit stable and unstable states. A trigger pulse (such as the presence of a beat frequency) causes the one-shot circuit 40 to enter the unstable state. After entering the unstable state, the one-shot circuit returns to the stable state after a set time.

For example, the one-shot circuit 40 may convert a rising clock edge event (and/or a falling clock edge event) indicative of a beat frequency, into a fixed-width pulse, which is received by a lock-detecting charge pump 44. The lock-detecting charge pump 44 may include a charge pump integrator 46. The fixed-width pulse may be used to reset the charge pump integrator 46. The fixed-width pulse is first received at a switch 48 of the lock-detecting charge pump 44. The switch 48 may be, for example, an NMOS transistor. By resetting the charge pump integrator 46, a voltage may not reach a level VDD, which may be a predetermined threshold that correlates with a locked condition. When the voltage does not reach the level VDD, but is, instead, reset, the lock determination output signal 24 may be or include a low voltage or charge signal that indicates that the data signal 18 is not locked with the clock signal 20.

As such, if a fixed-width pulse is present in the one-shot output signal 42, the lock determination output signal 24 indicates that the data signal 18 is not locked with the clock signal 20. If, however, the one-shot output signal 42 does not include a fixed-width pulse, the lock determination output signal 24 indicates that the data signal 18 is locked with the clock signal 20, as described below.

If the one-shot output signal 42 does not include a fixed width pulse, as would occur in a locked condition (that is, there is no beat frequency), the charge pump integrator 46 may integrate the charge generated by a current source 50 into an integrating capacitor 52. The output from the integrating capacitor 52, namely an integrator output 54, may then pass through a saturating gain stage 56, which outputs the lock determination output signal 24 indicating that the data signal 18 is locked with the clock signal 20. The saturating gain state 56 may include, for example, a CMOS inverter, resulting in a rail-to-rail lock determination output signal. During this time, the predetermined voltage VDD remains at or above the locked threshold.

If the output signal 42 received from the one-shot circuit 40 includes a beat frequency, which may be indicated by a fixed-width pulse, the current source 50 does not reach a predetermined voltage VDD, but is reset. The resetting of the of the current source 50 pulls the voltage low, so that it is below the locked threshold. In this manner, the lock detector 16 outputs the lock determination output signal 24 as a low voltage or charge level that indicates that the data signal 18 is not locked with the clock signal 20. If, however, the one-shot output signal 42 from the one-shot circuit 40 does not include a beat frequency (for example, does not include a fixed-width pulse), the current source 50 reaches the predetermined voltage VDD, and the lock detector 16 outputs the lock determination output signal 24 as a voltage or charge level that is at or exceeds the locked threshold that indicates that the data signal 18 is locked with the clock signal 20.

FIG. 3 illustrates a flow chart of an NRZ data lock detection method, according to an embodiment of the present disclosure. The method may begin at 100, in which a data signal (such as an NRZ data signal) is received, such as by a receiver or a phase detector. At 102, the data signal is compared, correlated, or combined with an associated clock signal. For example, a phase detector may combine the data signal with the associated clock signal to form a compared, combined, or correlated data signal.

At 104, the compared data signal, which may include the data signal and the clock signal, is output to a lock detector as a phase detection output signal. At 106, the phase detection output signal may be filtered, such as through an integrating capacitor and/or a hysteresis circuit. Alternatively, 106 may be omitted.

At 108, it is determined whether the phase detection output indicates a frequency difference between the data signal and the clock signal. The presence of a frequency difference yields a beat frequency. If there is no difference between the data signal and the clock signal (that is, there is no beat frequency), a current source remains at a predetermined lock level at 110. As such, a lock determination output signal indicative of a locked state or condition between the data signal and the clock signal is output at 112.

If, however, there is a difference between the data signal and the clock signal (that is, there is a beat frequency), the current source resets at 114, such that the current source does not reach the predetermined lock level. Then, at 116, a lock determination output signal is output that indicates an unlocked state between the data signal and the clock signal.

Referring to FIGS. 1-3, by determining the phase relationship between the data signal 18 and the clock signal 20, the system and method are configured to determine whether the data signal 18 is locked (for example, in phase) or unlocked (for example, out of phase) with the clock signal 20. When the data signal 18 is locked with the clock signal 20, then the data is being sampled at the center of an eye diagram. Data sampled at the center of the eye is typically reliable. However, when the data signal 18 and the clock signal 20 are unlocked, data may not being sampled from the eye center, and therefore the data may be less reliable.

Figure 4:
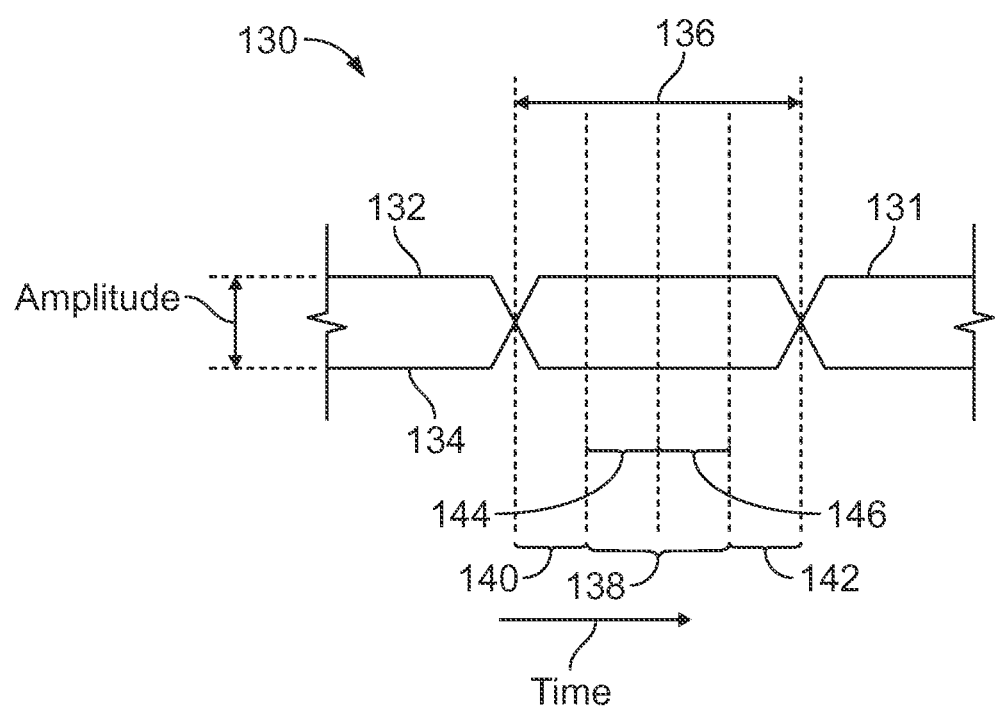
FIG. 4 illustrates an eye diagram of an NRZ signal, according to an embodiment of the present disclosure.

FIG. 4 illustrates an eye diagram 130 of an NRZ signal 131, according to an embodiment of the present disclosure. As noted above, the NRZ signal 131 may be the data signal 18, shown in FIG. 1. For example, the phase detector 14 may sample the data signal to produce the sampled data signal, in the form of the NRZ signal 131. Referring to FIGS. 1 and 2, the eye diagram 130 may be formed through an analysis of the sampled data signal by the phase detector 14.

Referring to FIG. 4, in particular, the eye diagram 130 may include first and second logic levels 132 and 134. For example, the first logic level 132 may be 1, while the second logic level 134 may be 0. Alternatively, the first logic level 132 may be +1, while the second logic level 134 may be −1. The difference between the first and second logic levels 132 and 134 represents an amplitude of the NRZ signal 131.

A single unit interval 136 of the NRZ signal 131 may include a middle region 138 and edge regions 140 and 142. The middle region 138 may be split into middle halves 144 and 146. Accordingly, the unit interval 136 may include four regions 140, 144, 146, and 142, each of equal duration. For example, the unit interval 136 may last a total of 40 ps, with the leading edge region 140 being the first 10 ps, the middle half 144 being the second 10 ps, the middle half 146 being the third 10 ps, and the trailing edge region 142 being the fourth 10 ps. It is to be understood, however, that the unit interval 136 may be shorter or longer than 40 ps. Further, while the unit interval 136 is shown split evenly among four separate regions 140, 144, 146, and 142, the unit interval 136 may be split among more or less regions. For example, the unit interval 136 may include a leading edge region, a middle region, and a trailing edge region, with the leading edge region lasting the first ⅓ of the unit interval 136, the middle region lasting the second ⅓ of the unit interval 136, and the trailing edge region lasting the final ⅓ of the unit interval.

As shown in FIG. 4, the eye diagram 130 shows a perfect eye pattern in which NRZ data transitions occur in the edge regions 140 and 142, as opposed to the middle region 138. Accordingly, a high quality eye diagram 130 includes data transitions at the edge regions 140 and 142. Referring to FIGS. 1-4, when the data signal 18 is locked with the clock signal 20, data sampling occurs within the middle region 138. However, when the data signal 18 is unlocked with the clock signal 20, the data sampling may drift outside of the middle region 138 into the edge regions 140 and 142, in which sampled data may be less reliable.

Embodiments of the present disclosure provide a system and method for detecting an unlocked condition between a NRZ signal and a reference clock, such as a clock signal. For example, a lock detector may detect a beat frequency from the output of a phase detector, and form a beat frequency signal or clock. The beat frequency signal may be received by a one-shot circuit that resets an always-on charge pump, for example, upon detection of the beat frequency signal. If regular reset events are detected, there is a frequency difference between the data signal and the reference clock, thereby indicating an unlocked condition.

As described above, embodiments of the present disclosure provide a system and method for determining whether or not a data signal, such as an NRZ data signal, is locked with respect to a clock signal. The system and method may detect the presence of a beat frequency that is generated by a difference between the data signal and the clock signal. The beat frequency may be detected by a lock detector. If a beat frequency is present, a current source is reset below a predetermined lock threshold, thereby indicating that the data signal is not locked with the clock signal. If, however, a beat frequency is not present (such that the data signal is in phase with the clock signal), the current source remains at or above the predetermined lock threshold, thereby indicating that the data signal is locked with the clock signal.

Embodiments of the present disclosure may be used with various data transmission systems. For example, embodiments of the present disclosure may be used with various telecommunication systems that transmit and receive NRZ data.

As used herein, the term "computer" or "module" may include any processor-based or microprocessor-based system including systems using microcontrollers, reduced instruction set computers (RISC), application specific integrated circuits (ASICs), logic circuits, and any other circuit or processor capable of executing the functions described herein. The above examples are exemplary only, and are thus not intended to limit in any way the definition and/or meaning of the term "computer" or "module."

The computer or processor executes a set of instructions that are stored in one or more storage elements, in order to process data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the subject matter described herein. The set of instructions may be in the form of a software program. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to user commands, or in response to results of previous processing, or in response to a request made by another processing machine.

The block diagrams of embodiments herein may illustrate one or more circuits or modules. It is to be understood that the modules represent circuit modules that may be implemented as hardware with associated instructions (e.g., software stored on a tangible and non-transitory computer readable storage medium, such as a computer hard drive, ROM, RAM, or the like) that perform the operations described herein. The hardware may include state machine circuitry hardwired to perform the functions described herein. Optionally, the hardware may include electronic circuits that include and/or are connected to one or more logic-based devices, such as microprocessors, processors, controllers, or the like. Optionally, the modules may represent processing circuitry such as one or more field programmable gate array (FPGA), application specific integrated circuit (ASIC), or microprocessor. The circuit modules in various embodiments may be configured to execute one or more algorithms to perform functions described herein. The one or more algorithms may include aspects of embodiments disclosed herein, whether or not expressly identified in a flowchart or a method.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

While various spatial terms, such as upper, bottom, lower, mid, lateral, horizontal, vertical, and the like may be used to describe embodiments of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the disclosure without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A data lock detection system, comprising:
a receiver configured to receive a data signal;
a phase detector configured to output a phase detection output signal representative of the data signal with respect to a clock signal; and
a lock detector configured to receive the phase detection output signal, wherein the lock detector is configured to determine a presence of a frequency difference between the data signal and the clock signal and output a lock determination output signal that indicates if the data signal is locked or unlocked with the clock signal, wherein the lock detector comprises a lock-detecting charge pump including a charge pump integrator and a switch, wherein the switch resets a current source upon detection of a beat frequency between the data signal and the clock signal, and wherein a resetting of the current source indicates that the data signal is unlocked with the clock signal.

2. The data lock detection system of claim 1, wherein the data signal is locked with the clock signal when the frequency difference between the data signal and the clock signal is zero.

3. The data lock detection system of claim 1, wherein the data signal is unlocked with the clock signal when the frequency difference is a beat frequency between the data signal and the clock signal.

4. The data lock detection system of claim 1, wherein the lock detector comprises a one-shot circuit configured to output a one-shot output signal that indicates whether or not a beat frequency exists between the data signal and the clock signal.

5. The data lock detection system of claim 1, further comprising a filtering circuit that is configured to filter the phase detection output signal.

6. The data lock detection system of claim 5, wherein the filtering circuit comprises one or both of a charge integrating capacitor and a hysteresis circuit.

7. The data lock detection system of claim 1, wherein the lock detector includes a receiver that receives the phase detection output from the phase detector.

8. The data lock detection system of claim 1, wherein the data signal comprises a non-return-to-zero (NRZ) data signal.

9. A data lock detection method, comprising:
receiving a data signal;
outputting a phase detection output signal with a phase detector, wherein the phase detection output signal is representative of the data signal with respect to a clock signal;
using a lock detector to determine a presence of a frequency difference between the data signal and the clock signal;
outputting a lock determination output signal that indicates if the data signal is locked or unlocked with the clock signal; and
resetting a current source upon detection of a beat frequency between the data signal and the clock signal, wherein a current source being reset is indicative of the data signal being unlocked with the clock signal.

10. The data lock detection method of claim 9, wherein the outputting a lock determination output signal comprises outputting a locked signal when the frequency difference between the data signal and the clock signal is zero.

11. The data lock detection method of claim 9, wherein the outputting a lock determination output signal comprises outputting an unlocked signal when the frequency difference is a beat frequency between the data signal and the clock signal.

12. The data lock detection method of claim 9, wherein the using a lock detector comprises using a one-shot circuit to output a one-shot output signal that indicates whether or not a beat frequency exists between the data signal and the clock signal.

13. The data lock detection method of claim 9, further comprising filtering the phase detection output signal.

14. The data lock detection method of claim 9, further comprising receiving the phase detection output from the phase detector with a receiving charge pump.

15. The data lock detection system of claim 9, wherein the data signal comprises a non-return-to-zero (NRZ) data signal.

16. A non-return-to-zero (NRZ) data lock detection system, comprising:
a lock detector configured to receive a phase detection output signal representative of an NRZ data signal with respect to a clock signal, wherein the lock detector is configured to determine a presence of a frequency difference between the NRZ data signal and the clock signal and output a lock determination output signal that indicates if the data signal is locked or unlocked with the clock signal, wherein the data signal is locked with the clock signal when the frequency difference between the data signal and the clock signal is zero, wherein the data signal is unlocked with the clock signal when the frequency difference is a beat frequency between the data signal and the clock signal, and wherein the lock detector comprises: (i) a receiver that receives the phase detection output, (ii) a one-shot circuit configured to output a one-shot output signal that indicates whether or not the beat frequency exists between the data signal and the clock signal, and (iii) a lock-detecting charge pump including a charge pump integrator and a switch, wherein the switch resets a current source upon detection of the beat frequency between the data signal and the clock signal, and wherein a resetting of the current source indicates that the data signal is unlocked with the clock signal.

17. The NRZ data lock detection system of claim 16, further comprising:
   a receiver configured to receive the NRZ data signal;
   a phase detector configured to output the phase detection output signal; and
   a filtering circuit that is configured to filter the phase detection output signal.

18. The NRZ data lock detection system of claim 16, wherein the filtering circuit comprises one or both of a charge integrating capacitor and a hysteresis circuit.

* * * * *